(12) United States Patent
Babella et al.

(10) Patent No.: US 6,668,347 B1
(45) Date of Patent: Dec. 23, 2003

(54) BUILT-IN SELF-TESTING FOR EMBEDDED MEMORY

(75) Inventors: Anthony Babella, Salida, CA (US); Patrick P. Chan, Roseville, CA (US); Chih-Jen (Mike) Lin, Portland, OR (US); Thomas J. Shewchuk, Rancho Murieta, CA (US); Daniel S. Lee, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/566,621

(22) Filed: May 8, 2000

(65) Prior Publication Data (65)

(51) Int. Cl.⁷ ................................. G01R 31/28
(52) U.S. Cl. ....................... 714/733; 714/730
(58) Field of Search .................. 714/733, 738, 714/739, 742, 743, 726, 729, 730, 724, 718; 377/54, 64, 67, 73; 711/200, 213, 217

(56) References Cited

U.S. PATENT DOCUMENTS

| | | | | |
|---|---|---|---|---|
| 5,349,587 A | * | 9/1994 | Nadeau-Dostie et al. | ... 714/729 |
| 5,469,443 A | * | 11/1995 | Saxena | ........................ 714/720 |
| 5,675,545 A | * | 10/1997 | Madhavan et al. | ......... 365/201 |
| 6,452,848 B1 | * | 9/2002 | Obremski et al. | .......... 365/201 |

* cited by examiner

Primary Examiner—Christine T. Tu
(74) Attorney, Agent, or Firm—Fish & Richardson P.C.

(57) ABSTRACT

An integrated circuit having a central built-in self-test unit (BIST) that uses internal scan chains for testing embedded memory modules. The embedded memory modules receive address and data signals from a set of input flip-flops configured to form a scan chain. The BIST is coupled to an input scan chain and includes a pattern generator to shift a test pattern into the input scan chain for testing the embedded memory modules. Output flip-flops capture data from the embedded memory modules are also configured as a scan chain. The BIST includes address control logic to bypass the normal addressing logic of the embedded memory module when the BIST operates is operating in a memory test mode.

25 Claims, 5 Drawing Sheets

BUILT-IN SELF-TESTING FOR EMBEDDED MEMORY

BACKGROUND

This invention relates to a built-in self-test unit (BIST) for embedded memory.

Application specific integrated circuits (ASICs) are widely used in various electronic components and often include complete memory systems. Generally, there are two methods for testing embedded memory within an integrated circuit. One method uses external test equipment connected to external pins of the chip and tests the embedded memory by generating various test patterns. If the data read from the memory system does not match the data written, the memory system is deemed defective. The use of the external test equipment requires that each embedded memory module be connected to one or more externally accessible pins, thereby increasing routing overhead and pin count.

A second method is to incorporate a built-in self-test unit (BIST) within the integrated circuit in order to test the embedded memory. The BIST is activated when the integrated circuit receives power, or when triggered from an external signal, and tests the embedded memory by applying a test pattern and comparing the applied test pattern to data read from the embedded memory. Based on the comparison, the BIST sets an externally available pin to indicate whether or not an error was detected. This approach reduces the number of external connections needed for such testing and allows multiple memory modules to be tested simultaneously, thereby reducing test time.

DESCRIPTION

Figure 1:
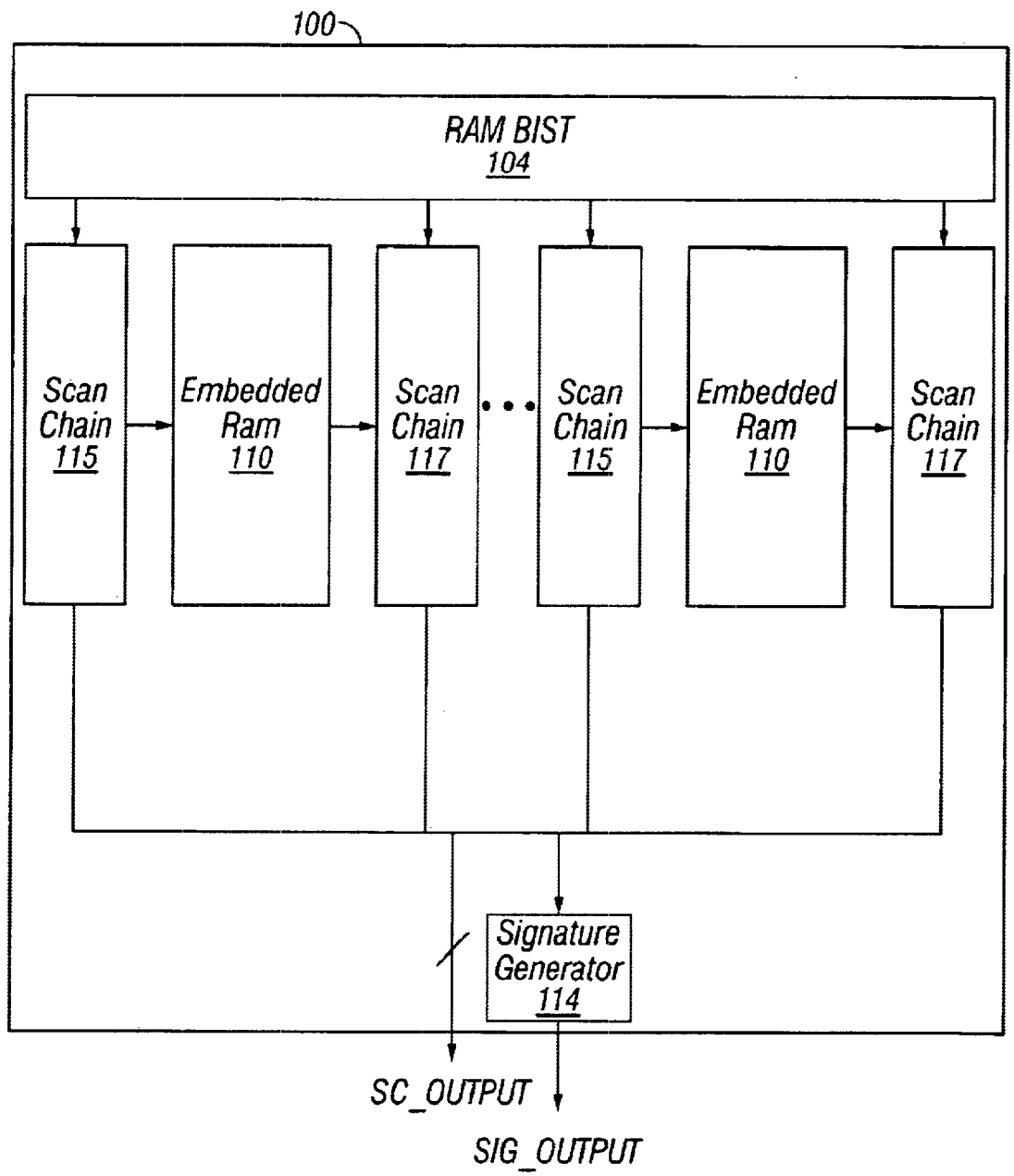
FIG. 1 is a block diagram illustrating a semiconductor memory device having a central built-in self-test unit.

FIG. 1 is a block diagram illustrating an integrated circuit 100 having a central built-in self-test unit (BIST) 104 for simultaneously testing embedded memory modules 110. Memory modules 110 represent any memory module suitable for embedding within a single chip, such as embedded dynamic random access memory (DRAM) or static random access memory (SRAM). Furthermore, each memory module 110 can have different address and data widths.

BIST 104 reduces routing overhead and space requirements associated with built-in test units by using internal scan chains 115 and 117 to simultaneously test embedded memory modules 110 within integrated circuit 100. A scan chain is a series of scan flip-flops that are configured to operate as a large shift register and is generally used to detect structural faults of integrated circuit 100.

In order to facilitate testing during manufacturing, the internal flip-flops of integrated circuits are often implemented as scan flip-flops and configured to form one or more internal scan chains. Each scan flip-flop includes a multiplexer to select between a first input data signal that captures the result of normal operation and a second input signal for shifting during scan. Test data is generally scanned in and out of the scan chains to verify the operation of the internal logic. The number of scan chains within an integrated circuit is determined by a number of factors including the number of total flip-flops on the integrated circuit, the maximum number of flip-flops per chain and the number of different clock sources within the integrated circuit.

Referring to FIG. 1, integrated circuit 100 includes scan chains 115 and 117 for each embedded memory module 110. More specifically, the flip-flops that normally store input address and data information for embedded memory modules 110 are configured to form input scan chains 115. Similarly, the flip-flops that normally hold output data read from memory modules 110 are configured to form output scan chains 117. In another implementation, these flip-flops could be configured to form a scan chain for each memory module 110 or even a single, lengthy scan chain given the constraints discussed above. In addition, a scan chain 115 or 117 can be configured to operate as an input/output scan chain so as to receive data from a first embedded memory module 110 and provide data to a second embedded memory module 110.

Upon activation, BIST 104 generates one of a number of test patterns, such as a checkerboard pattern (0101...01), an inverse checkerboard pattern (1010...10) and a pseudo-random pattern, and initializes scan chains 115 and 117 by shifting in the generated test pattern. In order to test memory modules 110, BIST 104 overrides the normal read/write and address logic for memory modules 110, clocks the test pattern from scan chains 115, and reads data from embedded memory modules 110 into scan chains 117. After reading the data from memory modules 110, BIST 104 shifts the test pattern and the output data through scan chains 115 and 117, respectively, to externally available scan chain output pins SC_OUTPUTS and to signature generator 114.

In order to determine whether memory modules 110 are functioning properly, the scan chain output pins SC_OUTPUTS can be monitored in order to detect any failure by one or more memory module 110. In addition, signature generator 114 combines outputs of the scan chains 115 and 117 and produces SIG_OUT. In one implementation signature generator 114 comprises a bank of XOR gates such that an error signal on SIG_OUT indicates an odd number of failures for each read cycle.

Figure 2:
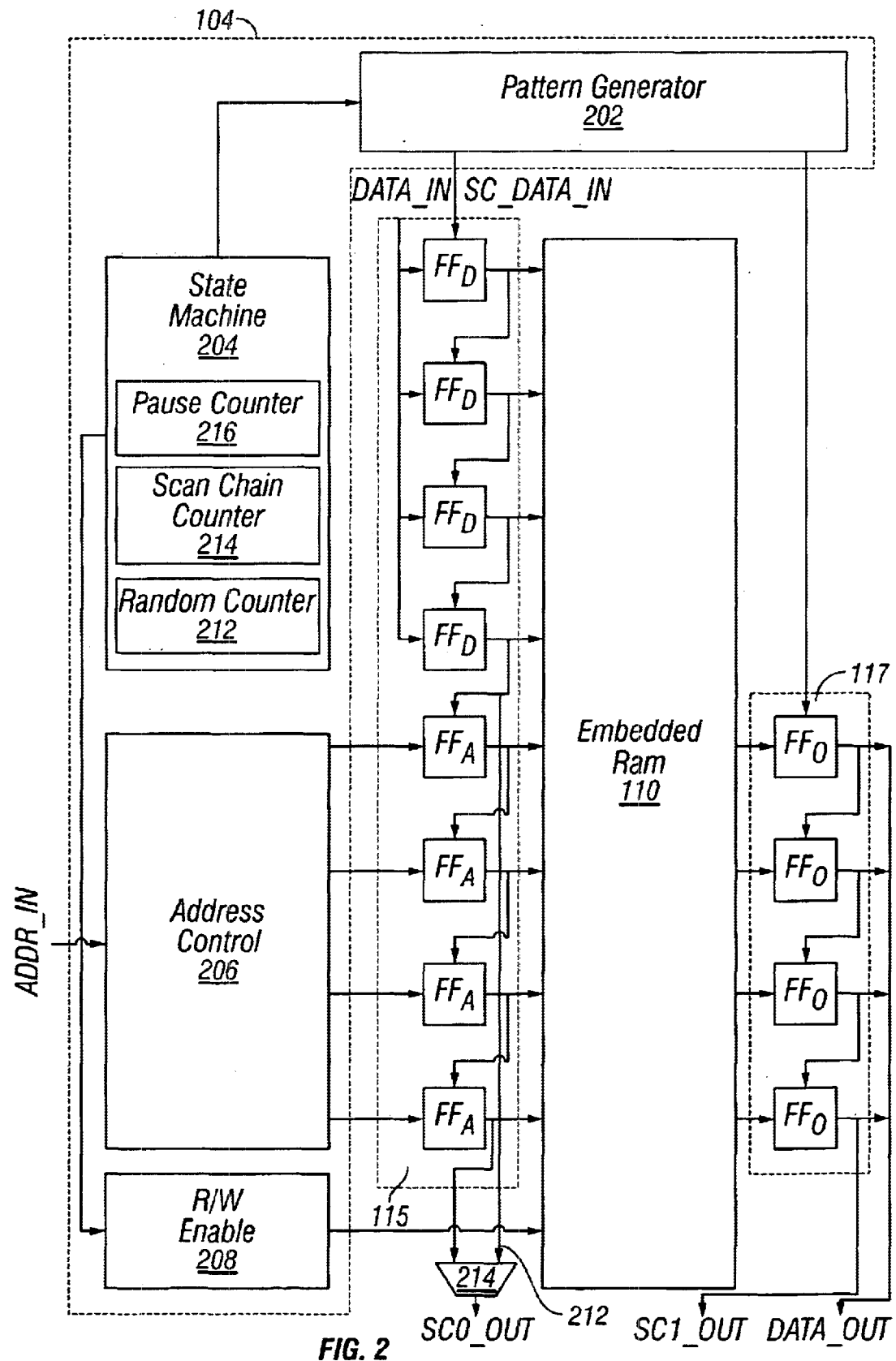
FIG. 2 is a block diagram illustrating an exemplary semiconductor memory device having a BIST and a single embedded memory module.

FIG. 2 is a block diagram illustrating one embodiment of integrated circuit 104 having a single embedded memory module 110 and BIST 104 that includes pattern generator 202, state machine 204, address control 206 and read/write enable 208. Embedded memory module 110 is illustrated to have four bit data and address widths but could have any data and address widths such as 16, 32 and 64 bits.

State machine 204 controls the functionality and operation of the other components of BIST 104 including the type of pattern produced by pattern generator 202 and the propagation of the patterns through scan chains 115 and 117. In addition, state machine 204 controls the read/write operations on embedded memory module 110, the capture of data into scan chain 117 and the shifting of data from scan chains 115 and 117 to externally-available pins SC0_OUT and SC1_OUT, respectively, and to signature generator 114.

Pattern generator 202 generates a variety of test patterns for driving embedded ram 210 such as a checkerboard pattern of alternating ones and zeros, an inverse checkerboard pattern and a pseudo-random pattern.

State machine 204 includes three binary count-up counters: random counter 212, scan chain length counter 214 and pause counter 216. Random counter 212 is used to determine a duration for operating BIST 104 in a random test mode. Scan chain counter 214 is used to count the number of cycles necessary to fill scan chains 115 and 117 and to shift the contents through SC0_OUT. Pause counter 216 allows BIST 104 to perform data retention tests on embedded memory modules 210.

Scan chain 115 includes data flip-flops $FF_D$ and address flip-flops $FF_A$ that may be either external or internal to embedded memory module 110. Data flip-flops $FF_D$ normally receive input data signals DATA_IN, but operate as a shift register and receive scan data signal SC_DATA_IN when BIST 104 is operating in test mode. Scan chain 115 further includes four address flip-flops $FF_A$ that provide address signals to embedded memory module 110. Normally the address control 206 passes address signals ADDR_IN to address flip-flops $FF_A$. Data flip-flops $FF_D$ are "stitched" such that data from pattern generator 202 propagates from a lowest data bit to a highest data bit. Similarly, address flip-flops $FF_A$ are stitched such that data from pattern generator 202 propagates from a lowest address bit to a highest address bit.

When operating in test mode, address control 206 bypasses the normal address control logic of memory module 110 and provides full control over the address signals. Similarly, R/W enable 208 bypasses the normal read/write control logic of memory module 110 and provides full control over the read enable and write enable signals.

Figure 3:
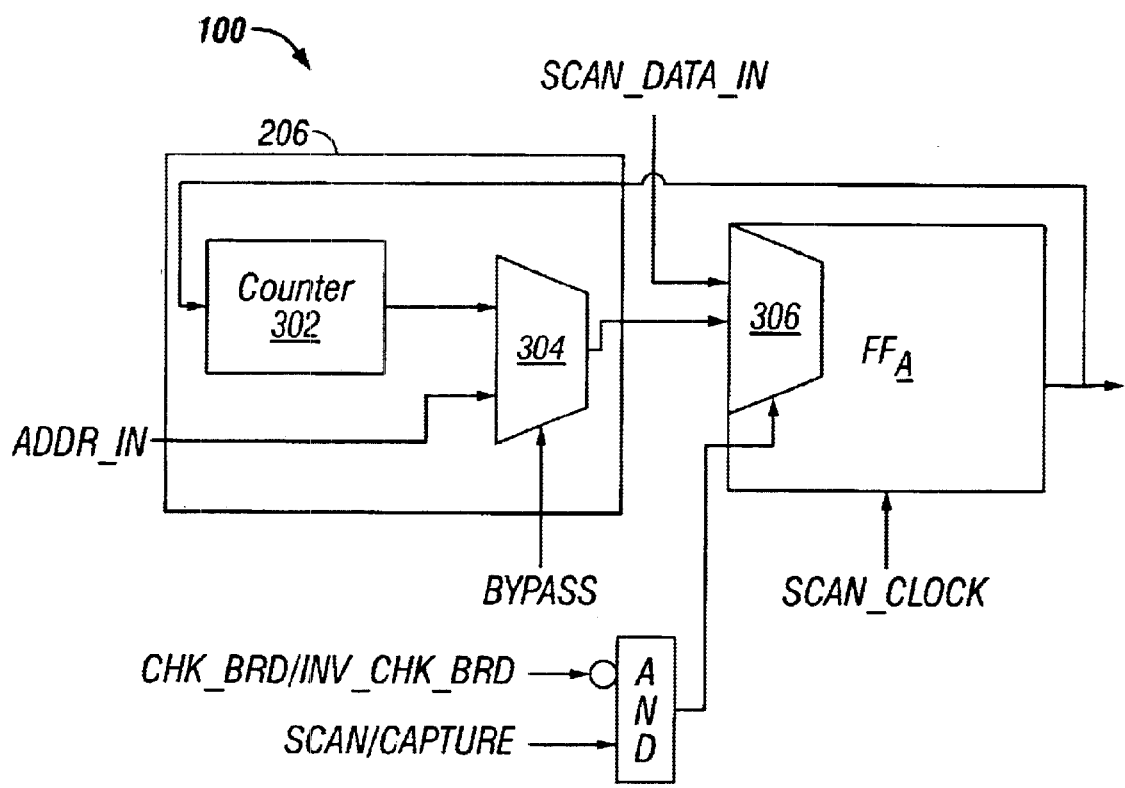
FIG. 3 is a block diagram illustrating one implementation of address control logic within the BIST.

FIG. 3 is a block diagram illustrating one implementation of address control 206 that receives input address signals ADDR_IN and provides RAM_ADDR_IN signals to address flip-flops $FF_A$ of scan chain 115. Address control 206 includes bypass counter 302 that is capable of cycling from zero to a maximum address for embedded memory module 110. Bypass signal BYPASS controls multiplexer 304, which selects between a bypass address provided by bypass counter 302 and the normal address signal ADDR_IN. During testing, address control 206 writes a test pattern from data flip-flop $FF_D$ (FIG. 2) into the entire address space of memory module 110. State machine 204 provides signals SCAN/CAPTURE and CHK_BRD/INV_CHK_BRD that controls whether multiplexer 306 of address flip-flop $FF_A$ loads an address signal from multiplexer 304 or loads scan data SCAN_IN from the previous flip-flop in the scan chain 115.

Figure 4:
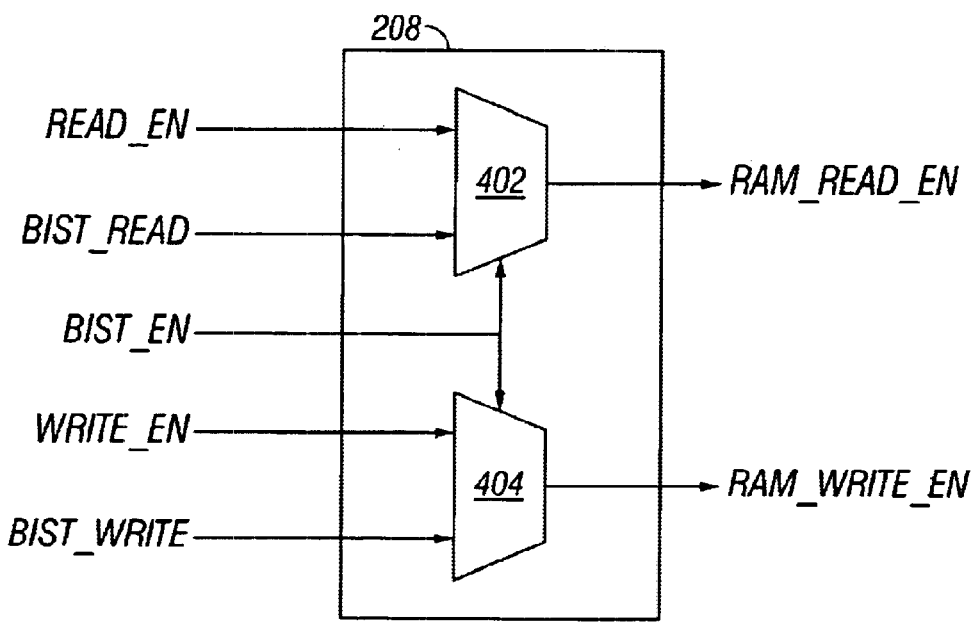
FIG. 4 is a block diagram illustrating one implementation of read/write (R/W) enable logic within the BIST.

FIG. 4 is a block diagram illustrating one implementation of R/W enable 208 capable of overriding read/write enable signals READ_ENABLE and WRITE_ENABLE. R/W enable 208 includes a first multiplexer 402 for selectively providing READ_ENABLE and BIST_READ to memory module 110 as RAM_READ_EN. Similarly, R/W enable 208 includes a second multiplexer 404 for selectively providing WRITE_ENABLE and BIST_WRITE to memory module 110 as RAM_WRITE_EN. Multiplexers 402 and 404 are controlled by BIST_EN signal, which is active when BIST 104 is memory test mode.

Figure 5:
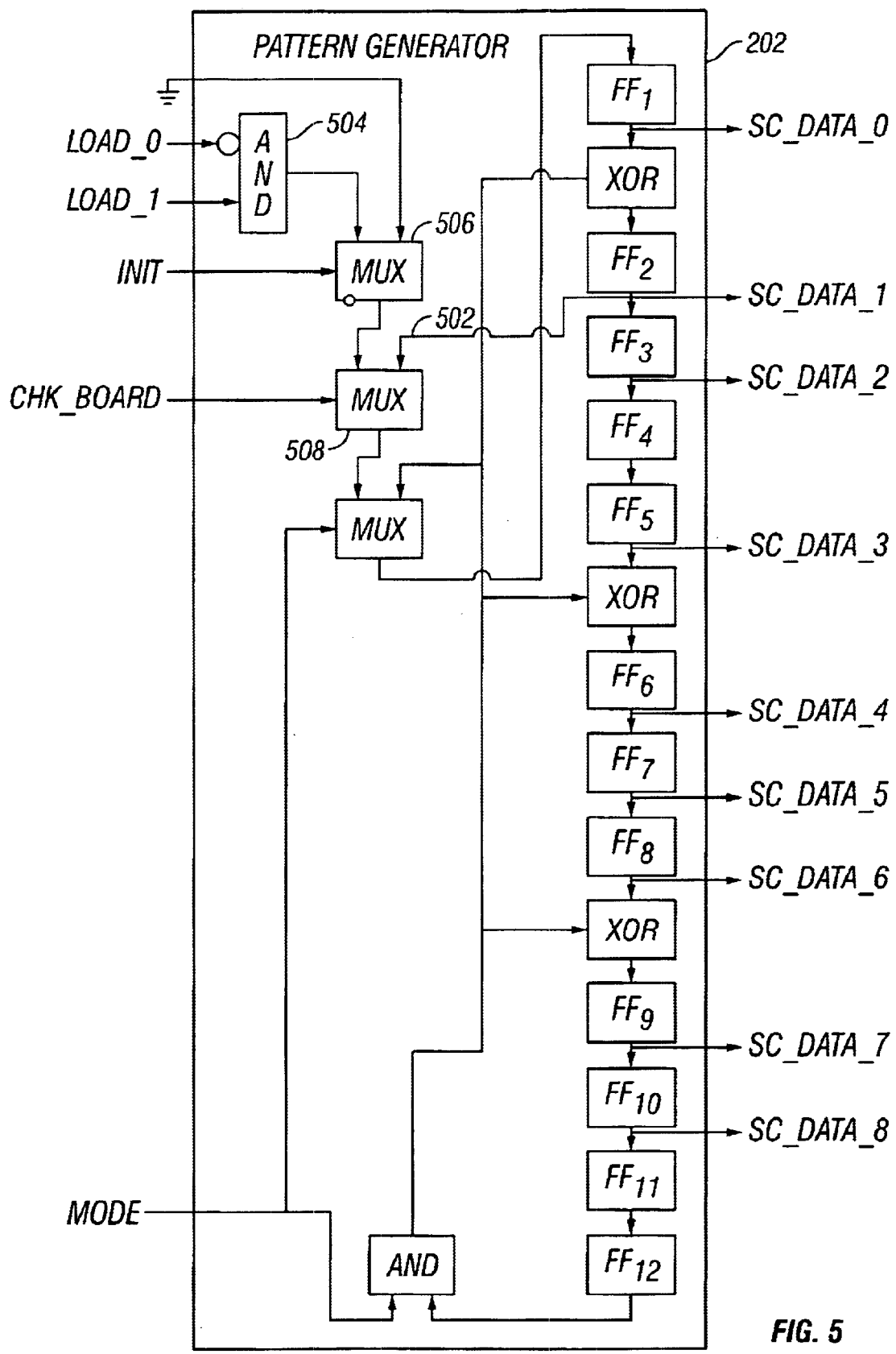
FIG. 5 illustrates one implementation of a pattern generator within the BIST.

FIG. 5 illustrates one implementation of pattern generator 202 having eight scan chain outputs SC_OUT1 through SC_OUT8. Pattern generator 202 is a modified linear feedback shift register (LSFR) that includes gate 504, multiplexer 506 and multiplexer 508 in order to operate in a deterministic manner and generate the checkerboard and inverse checkerboard test patterns.

State machine 204 seeds pattern generator 202 with the checkerboard or inverse checkerboard test pattern by applying a seed pattern, having alternating zeros and ones, to LOAD_1 setting LOAD_0 low, and setting the control signals INIT and CHK_BOARD. After two clock cycles flip-flops $FF_1$ and $FF_2$ are loaded with the initial pattern that is fed back to $FF_1$ via feedback path 502. Once flip-flops $FF_1$ and $FF_2$ are loaded, state machine 204 switches CHK_BOARD such that multiplexer 506 selects data from feedback path 502 to finish seeding pattern generator 202. State machine 204 sets signal MODE to a logic level zero when BIST 104 uses the checkerboard or inverse checkerboard test patterns and a logic level one for random test mode.

Figure 6:
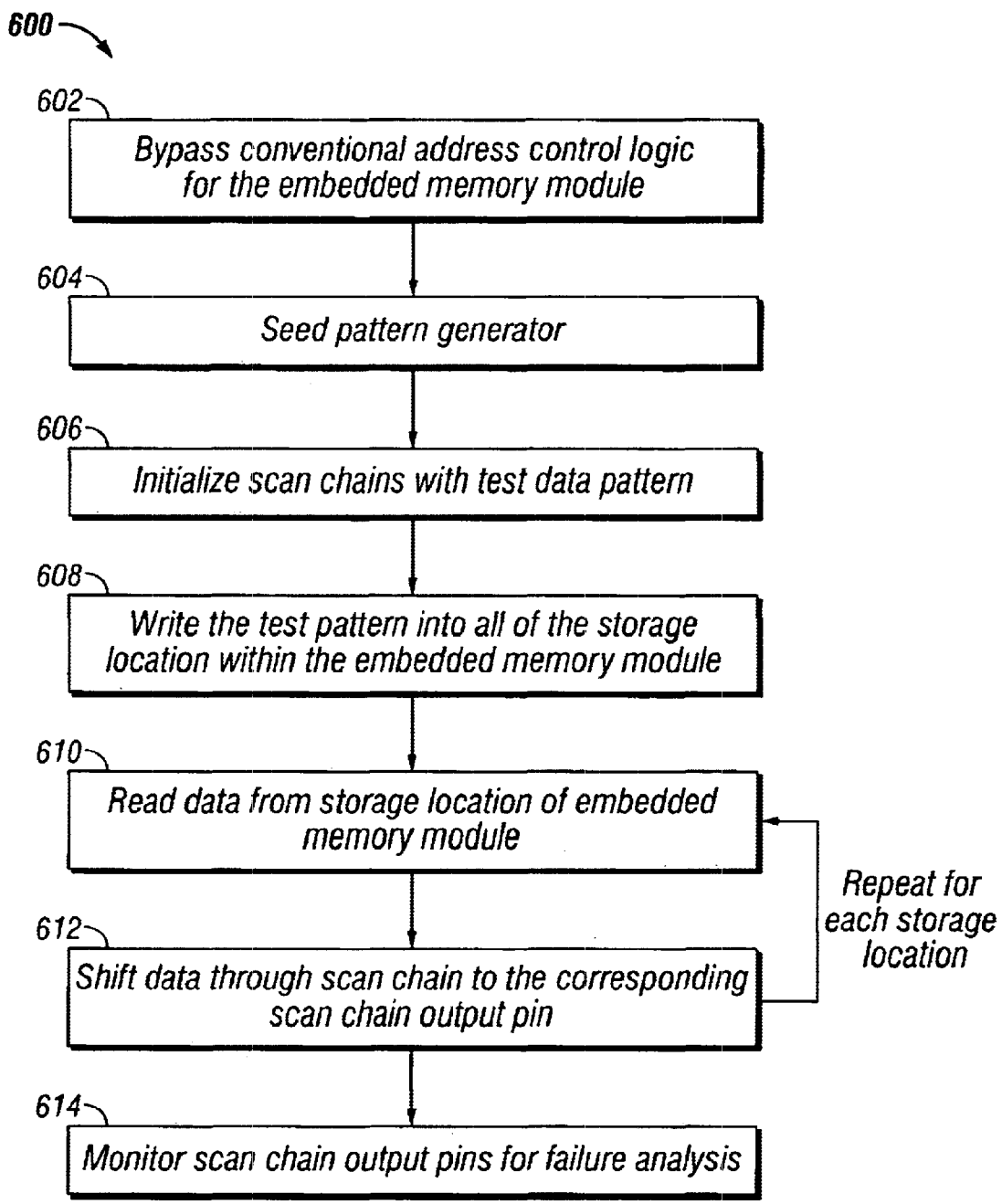
FIG. 6 is a flow chart illustrating a process by which the BIST uses a plurality of scan chains to test the embedded memory modules within the integrated circuit.

FIG. 6 is a flow chart illustrating a process 600 by which BIST 104 uses a plurality of scan chains to test embedded memory modules 110 within integrated circuit 100. State machine 204 drives the SCAN/CAPTURE signal (FIG. 3) low in order to configure the address flip-flops $FF_A$ to receive address information from address control 206 (602). In addition, isolation multiplexer 214 (FIG. 2) removes the address flip-flops $FF_A$ from scan chains 115 and state machine 204 bypasses the normal read/write logic for memory modules 110 by controlling read/write enable 208.

Next, state machine 204 seeds pattern generator 202 with one of a number of test patterns (604). Typical test patterns are a checkerboard pattern, an inverse checkerboard and a random pattern. State machine 204 initializes scan chains 115 and 117 by shifting the contents of the pattern generator through the scan chains until the longest scan chain is initialized (606). The scan chain counter 214 is used to count the number of cycles necessary to fill the scan chains.

Next, state machine 204 writes the test pattern from scan chains 115 into all of the addresses of embedded memory module 110 (608). More specifically, state machine 204 cycles bypass counters 302 for each memory module 110 from zero to the maximum addressable location for memory modules 110. In addition, state machine 204 drives the BIST_WRITE signal to enable write access to memory modules 110, thereby loading the addressable storage locations within each memory module 110 with data from the data flip-flops of the corresponding scan chain 115.

After filling the memory modules 110 with data, in checkerboard and inverse-checkerboard modes state machine 204 bypasses the read/write and address logic for memory modules 110 in order to read each storage location of embedded memory module 110 (610). After each read cycle, state machine 204 shifts the data through scan chain 117, as well as the original test pattern through scan chain 115, to the corresponding scan chain output pin and to signature generator 114 for failure analysis (612). State machine 204 cycles bypass counters 302 for each memory module 110 from zero to the maximum addressable location for memory modules 110. State machine 204 drives the BIST_READ signal to read data from each memory module 110 into the corresponding scan chain 117.

As data is read from the embedded memory modules 110, the scan chain output pins SC_OUTPUT, as well SIG_OUTPUT from signature generator 114, can be strobed by a production tester and the output can be compared to data generated during simulation in order to detect any failure and trace the failure to a particular memory module 110 (614).

When operating in a random test mode, BIST 104 initializes memory modules 110 with a checkerboard pattern according to the above steps 602 through 612 and additionally generates a pseudo-random test pattern using pattern generator 202 and propagates the test pattern through scan chains 115 and 117. After initializing the scan chains 115 and 117 with the pseudo-test pattern, BIST 104 performs one write operation and shifts scan chains 115 and 117 one clock cycle. BIST 104 then performs one read operation on memory modules 110 to read data into scan chain 117 and shifts scan chains 115 and 117 through SC_OUTPUT and SIG_OUTPUT. BIST 104 repeats this process for a duration defined by random counter 302. In this manner, BIST 104 writes pseudo-random data into pseudo-random addresses of memory modules 110. Output pins SC_OUTPUT and SIG_OUTPUT can again be strobed and the output compared to data generated during simulation in order to detect any failure.

This application is intended to cover any adaptation or variation of the present invention. It is intended that this invention be limited only by the claims and equivalents thereof.

What is claimed is:

1. A method comprising:
   generating a test pattern using a built-in test unit (BIST) within an integrated circuit;
   shifting the test pattern into an input scan chain;
   writing the test pattern from the input scan chain to a memory module embedded within the integrated circuit;
   reading data from the memory module to an output scan chain; and shifting the test data pattern and the read data through an XOR gate to determine errors one shift at a time.

2. The method of claim 1 wherein the input scan chain and the output scan chain are configured in to operate in synchronism with one another.

3. The method of claim 1 and further including shifting the test data pattern and the read data out of the input and output scan chains, respectively, to externally accessible pins.

4. The method of claim 1, wherein generating the test pattern includes seeding a pattern generator of a built-in self-test unit within the memory module with a checkerboard pattern, an inverse checker board pattern, or a random pattern.

5. The method of claim 1, wherein writing the test pattern includes bypassing address controls for the embedded memory module and using a bypass counter to sequentially write the test pattern into each address of the memory module.

6. The method of claim 1, wherein reading data from the memory module includes bypassing address controls for the embedded memory module and using a bypass counter to sequentially read data from each address of the memory module.

7. The method of claim 1, wherein generating a test pattern includes generating a random test pattern.

8. The method of claim 1 and further including repeating the writing of the data pattern to the memory module and the reading of data from the memory module for each address of the memory module.

9. A method comprising:
   generating a test pattern using a built-in test unit (BIST) within an integrated circuit;
   shifting the test pattern into an input scan chain; and
   writing the test pattern from the input scan chain to a memory module embedded within the integrated circuit,
   wherein the input scan chain includes address and data flip-flops for the embedded memory module.

10. A method comprising:
    generating a test pattern using a built-in test unit (BIST) within an integrated circuit;
    shifting the test pattern into an input scan chain;
    writing the test pattern from the input scan chain to a memory module embedded within the integrated circuit, wherein said writing the test pattern includes isolating address flip-flops from the input scan chain to receive address information from the BIST.

11. An integrated circuit comprising:
    an embedded memory module connected to address and data signal lines from a set of input flip-flops configured to form an input scan chain; and
    a built-in self-test unit (BIST) coupled to the input scan chain,
    wherein the embedded memory module provides output data signals to a set of output flip-flops configured to form an output scan chain,
    wherein the embedded memory module provides output data signals to a set of output flip-flops configured to form an output scan chain which checks the outputs one bit at a time.

12. The integrated circuit of claim 11, wherein the BIST further includes address control logic having a bypass counter storing a bypass address and a multiplexer to selectively provide the bypass address to the input flip-flops of the input scan chain when the BIST is operating in a memory test mode.

13. The integrated circuit of claim 12 and comprising a plurality of embedded memory modules, wherein the BIST contains a bypass counter for each embedded memory module.

14. The integrated circuit of claim 12, wherein the address control logic includes a plurality of multiplexers.

15. The integrated circuit of claim 11, wherein the BIST further includes read/write enable control logic to selectively provide BIST read/write enable signals and functional read/write enable signals to the embedded memory module.

16. The integrated circuit of claim 11, wherein the signature generator is a bank of XOR gates.

17. The integrated circuit of claim 11, wherein the BIST includes a pattern generator to shift a test pattern into the input scan chain for testing the embedded memory module.

18. An integrated circuit comprising:
    an embedded memory module connected to address and data signal lines from a set of input flip-flops configured to form an input scan chain; and
    a built-in self-test unit (BIST) coupled to the input scan chain, the BIST further including address control logic having a bypass counter storing a bypass address and a multiplexer to selectively provide the bypass address to the input flip-flops of the input scan chain when the BIST is operating in a memory test mode; and
    a plurality of embedded memory modules, wherein the BIST contains a bypass counter for each embedded memory module and wherein the address control logic includes isolation logic to isolate the address flip-flops from the input scan chain.

19. The integrated circuit of claim 18, wherein the isolation logic comprises a multiplexer.

20. An integrated circuit comprising:
    an embedded memory module connected to address and data signal lines from a set of input flip-flops configured to form an input scan chain; and a built-in self-test unit (BIST) coupled to the input scan chain wherein the BIST includes a random counter, a scan chain length counter and a pause counter.

21. An integrated circuit comprising:

an embedded memory module connected to address and data signal lines from a set of input flip-flops configured to form an input scan chain; and a built-in self-test unit (BIST) coupled to the input scan chain, wherein the BIST includes address control logic having a bypass counter storing a bypass address and a multiplexer to selectively provide the bypass address to the input flip-flops of the input scan chain when the BIST operates is operating in a memory test mode, and wherein the data flip-flops of the input scan chain are stitched in order from a lowest data bit to a highest data bit.

22. An integrated circuit comprising:

an embedded memory module connected to address and data signal lines from a set of input flip-flops configured to form an input scan chain; and a built-in self-test unit (BIST) coupled to the input scan chain wherein the input flip-flops of the input scan chain are stitched in order from a lowest address bit to a highest address bit.

23. A built-in self-test unit (BIST) for testing memory modules embedded within an integrated circuit comprising:

address control logic to selectively provide a bypass address to the embedded memory module; and read/write enable control logic to override read/write enable signals of the embedded memory modules with BIST read/write enable signals, wherein the embedded memory module provides output data signals to a set of output flip-flops configured to form an output scan chain, wherein the integrated circuit includes a signature generator coupled to the input scan chain and the output scan chain which receives shifted bits from the input scan chain and output scan chain and verifies the bits one shift at a time.

24. The built-in self-test unit (BIST) of claim 23 and further including a pattern generator providing a test pattern data signal to a plurality of scan chains within the integrated circuit.

25. A built-in self-test unit (BIST) for testing memory modules embedded within an integrated circuit comprising:

address control logic to selectively provide a bypass address to the embedded memory module; and read/write enable control logic to override read/write enable signals of the embedded memory modules with BIST read/write enable signals wherein the embedded memory module provides output data signals to a set of output flip-flops configured to form an output scan chain wherein the integrated circuit includes a signature generator coupled to the input scan chain and the output scan chain, wherein the address control logic includes:
a bypass counter storing the bypass address;
a multiplexer outputting an address signal from the bypass counter; and
isolation logic to isolate the address flip-flops from the input scan chain.

* * * * *